United States Patent
Nishioka

[11] Patent Number: 5,970,337
[45] Date of Patent: Oct. 19, 1999

[54] FERROELECTRIC FILM CAPACITOR WITH INTERGRANULAR INSULATION

[75] Inventor: Yasushiro Nishioka, Ibaraki, Japan

[73] Assignee: Texas Instruments Incorporated, Dallas, Tex.

[21] Appl. No.: 09/027,340

[22] Filed: Feb. 20, 1998

Related U.S. Application Data

[62] Division of application No. 08/501,840, Jul. 12, 1995, Pat. No. 5,854,499.

[30] Foreign Application Priority Data

Jul. 12, 1994 [JP] Japan .................................. 6-159966

[51] Int. Cl.$^6$ ................................................ H01L 21/8242
[52] U.S. Cl. ................................................ 438/240; 438/3
[58] Field of Search ................... 438/3, 238, 239, 438/240, 253, 254, 396, 397

[56] References Cited

U.S. PATENT DOCUMENTS 5,789,303  8/1998  Leung et al. .......................... 438/381
5,834,348  11/1998  Kwon et al. .......................... 438/240

*Primary Examiner*—Joni Chang
*Attorney, Agent, or Firm*—Gerald E. Laws; William B. Kempler; Richard L. Donaldson

[57] ABSTRACT

A method of making ferroelectric film capacitors with sufficient yield for application to ULSI. In a first embodiment, after formation of a first ferroelectric film as the capacitor ferroelectric film, a very thin second ferroelectric film is deposited to fill the cavity portions generated between the crystal grains. This reduces the leakage current and increases the capacitor yield. In second embodiment, the cavity portions are filled with an insulating layer.

15 Claims, 9 Drawing Sheets

FORMATION OF CRYSTAL PZT

FORMATION OF AMORPHOUS STO

FERROELECTRIC FILM CAPACITOR WITH INTERGRANULAR INSULATION

This is a divisional of Ser. No. 08/501,840, filed Jul. 12, 1995 now U.S. Pat. No. 5,854,499.

FIELD OF THE INVENTION

This invention pertains to a semiconductor device, and more specifically to a ferroelectric film capacitor that, when used in a semiconductor memory, has a high yield and a low leakage current.

BACKGROUND OF THE INVENTION

In conventional technology, in order to increase the integration degree of the semiconductor device, efforts have been made to reduce the size of the structural elements. For the dynamic memory (DRAM) which requires fine capacitors with high capacitances, application of ferroelectric films with very high specific dielectric constant is attractive. For example, several conventional technologies have been developed (such as that disclosed in P. J. Bhattacharya, et al.: Jpn. J. Appl. Phys., Vol. 32 (1993), pp. 4103–4106).

In the technology disclosed by Bhattacharya, et al., when $(Ba,Sr)TiO_3$ (referred to as "BST" hereinafter) film is formed on Pt substrate, the crystal of the film is grown in cylindrical form, and a specific dielectric constant as high as about 300 can be guaranteed. When capacitors are formed by using this type of film, it is possible to form capacitors with excellent insulating characteristics. On the other hand, however, many capacitors formed in this way have large leakage current or have initial short-circuit problems. Consequently, it is difficult to guarantee the yield to the level appropriate for mass production of DRAM and other ultra-LSI. Study of the reason indicates that cavities are formed on the intergranular crystal boundaries. One of the purposes of this invention is to provide a type of capacitor and its manufacturing method that can well guarantee the yield to the level appropriate for application in manufacturing ultra-LSI.

Also, for semiconductor devices, in particular, DRAM, capacitors with small areas are needed. In order to realize this type of capacitor, ferroelectric films made of $(Ba,Sr)TiO_3$, $Pb(Zr,Ti)O_3$, etc., with high dielectric constants are attractive. However, when these films are used to form capacitors, although the capacitors formed have excellent insulating characteristics, for many capacitors formed in this case, the leakage current is nevertheless high or initial short-circuit problems may take place, and it is impossible to guarantee the yield high enough for application of ULSI such as DRAM. One of the purposes of this invention is to provide capacitors which guarantee a yield sufficiently high for ULSI application and their manufacturing method.

SUMMARY OF INVENTION

A first ferroelectric film, having cavity portions among its crystal grains, is formed as the dielectric material of the capacitor. Then a second ferroelectric film much thinner than the first ferroelectric film is deposited to fill the cavity portions formed among the crystal grains, so that capacitors with small leakage current and high yield are formed. Also, as another form, after formation of the ferroelectric film, since an insulating layer is filled into the cavity portions among the crystal grains, it is possible to form ferroelectric films for forming capacitors with small leakage current and a high yield.

By means of the invention, it is possible to have excellent insulating characteristics between the capacitors of DRAM and the upper and lower electrodes, low leakage current, and reduced chance of initial short-circuit problems.

As a result, it is possible to minimize the leakage of the electric charge stored in the ferroelectric capacitor of DRAM. Consequently, it is possible to prolong the refresh cycle over that in the conventional method. Or, when the refresh cycle is maintained unchanged, it is possible to reduce the area of the memory cell. Consequently, it is possible to manufacture semiconductor memory devices with improved yield, appropriate for mass production.

In the figures, 1 is an oxidized Si substrate, 2 is a TiN film, 3 is a Pt film (lower electrode), 4 is a crystal BST film, 5 is an amorphous STO film, 6 is a crystal PZT film, 7 is an amorphous STO film, 8 is an amorphous BST film, and 9 is an amorphous PZT film.

DESCRIPTION OF EMBODIMENTS

Figure 1:
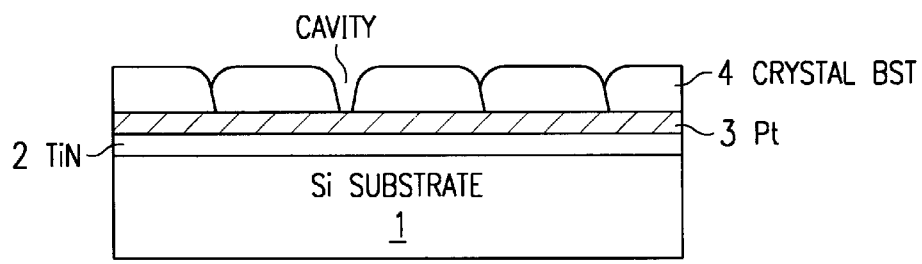
FIG. 1 is a cross-section of an intermediate processing step in the manufacture of a ferroelectric capacitor according to a first embodiment of the invention.

FIG. 1, illustrates the precondition of a first embodiment. A TiN film 2 with a thickness of about 50 nm is formed as an adhesive layer on oxidized silicon substrate 1 by sputtering, and then a 200 nm thick Pt film 3 is formed by sputtering. Next, a BST film 4 with a thickness of about 200 nm is deposited by using BST ceramic target material in an $O_2$/Ar mixed gas. In this case, the film is formed with the substrate temperature at about 650° C., and crystallized BST film 4 is formed. This is because if the temperature is lower than 500° C., the dielectric constant of the amorphous BST formed is about 30, much smaller than the specific dielectric constant of about 300 for the crystallized BST. Finally, a Pt upper electrode is formed. In this way, a capacitor is formed. Evaluation of the electrical characteristics of this capacitor indicates that for this type of crystalline BST film, the chance of problems caused by initial insulation breakdown is high, and it is impossible to guarantee a yield high enough for capacitors of ultra-LSI. Results of analysis of the BST film on a transmission electron microscope and detailed analysis of the electrical characteristics indicate that as shown in FIG. 1, it is quite possible that the initial insulation breakdown of the BST film is due to the cavities generated on the intergranular crystal boundaries of BST film 5. It is estimated that this cavity portion leads to short-circuits between the upper electrode and the lower electrode as Pt invades when the upper electrode Pt film is formed on the cavity portion. Consequently, in an embodiment of this invention, a test was made to repair the defects by forming laminated ferroelectric films to fill the cavities.

Figure 2:
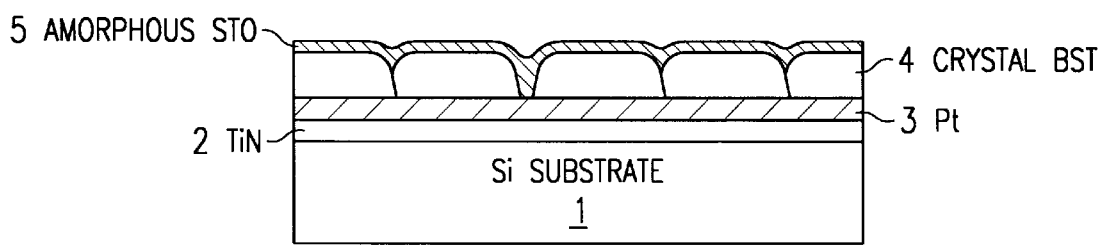
FIG. 2 is a cross-section illustrating another step in the manufacture of the capacitor of FIG. 1.

In the following, the concept of Embodiment 1 of this invention will be explained with reference to FIGS. 1 and 2. In Embodiment 1, the cavity defects of BST film 4 are repaired by applying a layer of $SrTiO_3$ (STO). After the configuration shown in FIG. 1 was formed, amorphous STO film 5 with a film thickness of 10 nm or less was formed on BST film 4 at substrate temperature of about 400° C. Then, a Pt upper electrode with a thickness of about 200 nm was formed using the sputtering method. This can be performed by using the conventional lithographic method for manufacturing capacitors. Also, since BST film 4 was crystallized, its specific dielectric constant reached about 300. However, the specific dielectric constant of STO film 5 is as small as 20. Consequently, the electrostatic capacitance of the laminated configuration is smaller than that of the monolayer configuration of BST film 4 by about 25%. However, due to this laminated configuration, the leakage current of the film can be improved by about 2 orders of magnitude, and the initial insulation breakdown rate caused by cavities of BST film 4 can be significantly reduced. Consequently, the yield of the capacitors formed can be increased significantly. The effects of this invention may also be realized by forming the laminated ferroelectric films from different types of materials. In this case, the effect is particularly significant.

According to this invention, by crystallizing the amorphous STO film, the effect can be further improved. That is, after formation of the amorphous STO film, heat treatment is performed at 650° C. in oxygen to perform crystallization. In this case, the specific dielectric constant can be increased to about 150. Consequently, the decrease of the overall electrostatic capacitance of the capacitor can be suppressed to about 10%. Also, the yield can be increased.

Figure 3:
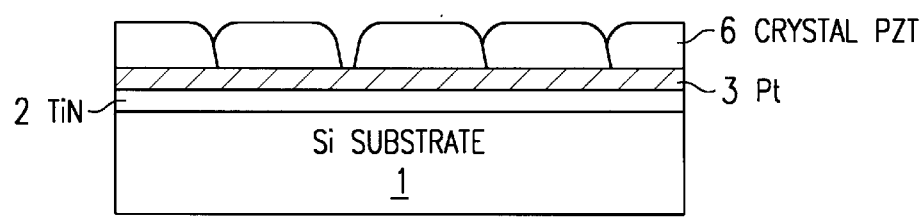
FIG. 3 is a cross-section illustrating an intermediate processing step in the manufacture of a ferroelectric capacitor according to a second embodiment of the invention.
Figure 4:
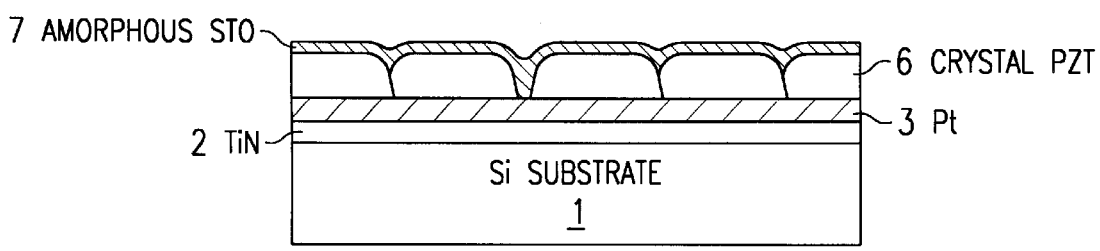
FIG. 4 is a cross-section illustrating an intermediate processing step in the manufacture of the ferroelectric capacitor of FIG. 3.

In the following, another embodiment of this invention will be explained with reference to FIGS. 3 and 4. In this embodiment, amorphous STO is deposited on the crystallized $Pb(Zr,Ti)O_3$ film (PZT). As shown in FIG. 3, on oxidized silicon substrate 1, a TiN film 2 with a thickness of about 50 nm was formed as an adhesive layer using the sputtering method. Then, a Pt film 3 with a thickness of 200 nm was formed by the sputtering method. Then, a crystallized PZT film 6 was formed using the sol-gel method. In this processing step, a solution prepared by dissolving organic compounds of metals of Pb, Zr, Ti, etc., in an organic solvent was coated by means of the spin coating method to form a layer with thickness of about 200 nm on Pt film 3. Then, baking was performed at about 150° C. to remove the organic solvent and moisture. Then, in order to crystallize the amorphous film, it was heat treated in an oxygen atmosphere at 650° C. However, when PZT film 6 was crystallized, contraction took place, forming cavities on the intergranular crystal boundaries as shown in FIG. 3. Then, as shown in FIG. 4, at a substrate temperature of about 400° C., an amorphous STO film 7 with a thickness of about 10 nm or less was formed on PZT film 6. Then, Pt upper electrode with a thickness of about 200 nm was formed. Then, the conventional lithographic method was used to form the capacitor. As PZT film 6 was crystallized, the specific dielectric constant reached about 600. However, the specific dielectric constant of amorphous STO film 5 is as small as 20. Consequently, the electrostatic capacitance of the laminated configuration is smaller than that of the monolayer configuration of PZT film 6 by about 60%. However, due to this laminated configuration, the leakage current of the film can be improved by about 3 orders of magnitude, and the initial insulation breakdown rate caused by cavities in PZT film 6 can be significantly reduced. Consequently, the yield of the capacitors formed can be increased significantly.

According to this invention, the effect can be improved by crystallization of the amorphous STO film. That is, after formation of the amorphous STO film, heat treatment is performed at 650° C. in oxygen to bring about crystallization. In this case, the specific dielectric constant can be increased to about 150. Consequently, decrease of the overall electrostatic capacitance of the capacitor can be suppressed to about 20%. Also, there is no adverse influence on the yield.

Figure 5:
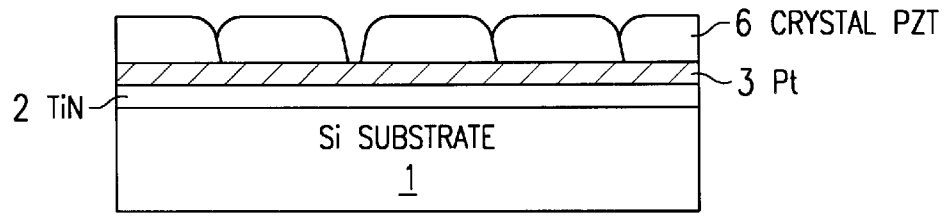
FIG. 5 is a cross-section illustrating an intermediate processing step in the manufacture of a ferroelectric capacitor of a third embodiment of the invention.
Figure 6:
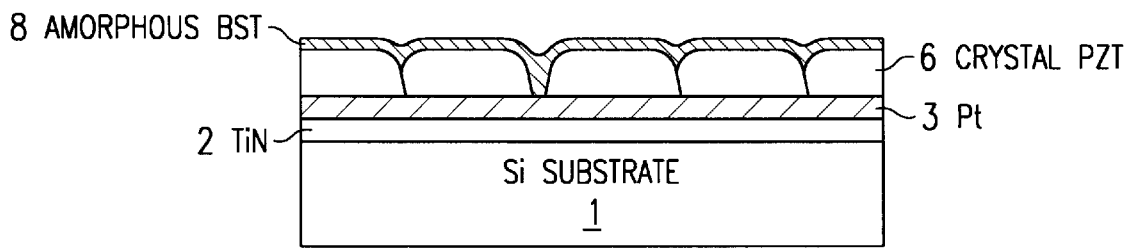
FIG. 6 is a cross-sectional illustrating an intermediate processing step in the manufacture of the ferroelectric capacitor of FIG. 5.

In the following, another embodiment of this invention will be explained with reference to FIGS. 5 and 6. In the embodiment, an amorphous STO film is deposited on a crystallized BST film or PZT film so as to improve the characteristics of the ferroelectric material. However, the STO film used has a relatively low specific dielectric constant. If an amorphous BST film with a higher dielectric constant is used instead, the decrease in the electrostatic capacitance can be reduced, and the characteristics can be further improved. FIG. 5 is a diagram illustrating another ferroelectric film. In this embodiment, first of all, on oxidized silicon substrate 1, a TiN film 2 with a thickness of about 50 nm was formed as an adhesive layer using the sputtering method. Then, a Pt film 3 with a thickness of 200 nm was formed by sputtering. Then, a crystallized PZT film 6 was formed using the sol-gel method. In this processing step, a solution prepared by dissolving organic compounds of metals of Pb, Zr, Ti, etc., in an organic solvent was coated by means of the spin coating method to form a layer with a thickness of about 200 nm on Pt film 3. Then, [the substrates] were baked at about 150° C. to remove the organic solvent and moisture. Then, in order to crystallize the amorphous film, there was heat treatment in an oxygen atmosphere at 650° C. However, when PZT film 6 was crystallized, contraction took place, forming cavities on the intergranular crystal boundaries as shown in FIG. 3. FIG. 6 is a cross-sectional view of the ferroelectric film. At a substrate temperature of about 500° C., an amorphous BST film 8 with a thickness of about 10 nm or less was formed on PZT film 6. Then, Pt upper electrode with a thickness of about 200 nm was formed. Then, the conventional lithographic method was used to form the capacitor. As PZT film 6 was crystallized, the specific dielectric constant reached about 600. On the other hand, the specific dielectric constant of amorphous BST film 8 is 30, that is, larger than the specific dielectric constant of 20 for the amorphous STO film. Consequently, the electrostatic capacitance of the laminated configuration is smaller than that of the monolayer configuration of PZT film 6 by only about 30%. On the other hand, due to this laminated configuration, the leakage current of the film can be improved by about 3 orders of magnitude, and the initial insulation breakdown rate caused by cavities of PZT film 6 can be significantly reduced. Consequently, the yield of the capacitors formed can be increased significantly.

According to this invention, the effect can be improved by crystallization of the amorphous BST film. That is, after formation of the amorphous STO film, heat treatment is carried out at 650° C. in oxygen to perform crystallization. In this case, the specific dielectric constant can be increased to about 300. Consequently, decrease of the overall electrostatic capacitance of the capacitor can be suppressed to about 10%. Also, there is no adverse influence on the yield.

The same effect has also been observed by depositing amorphous PZT film on the crystal BST film. That is, as the specific dielectric constant of the amorphous PZT film is about 40, the increase in the electrostatic capacitance can be further suppressed, and it is possible to form ferroelectric films for capacitors with higher yield.

Figure 7:
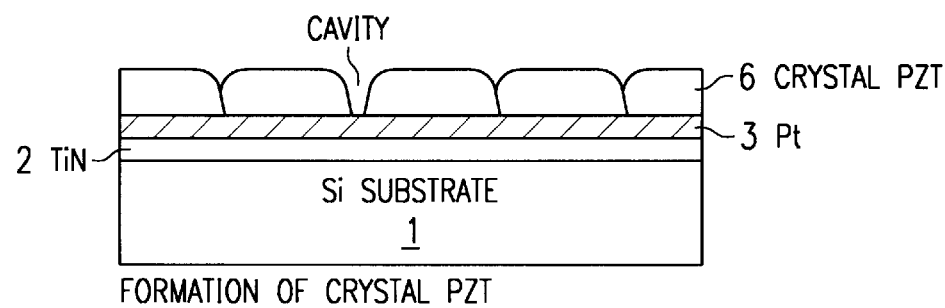
FIG. 7 is a cross-sectional view illustrating a further step in the manufacture process of the ferroelectric capacitor of FIG. 5.
Figure 8:
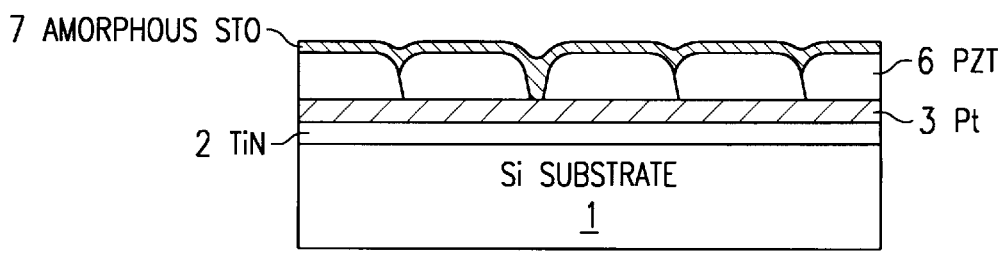
FIG. 8 is a cross-sectional view illustrating an intermediate processing step in the manufacture of a ferroelectric capacitor according to a fourth embodiment of the invention.
Figure 9:
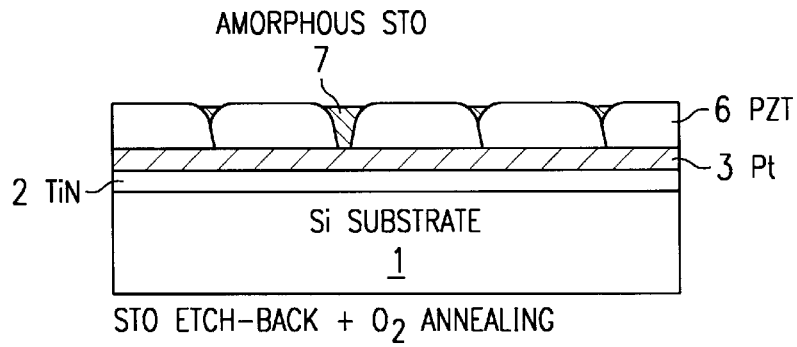
FIG. 9 is a cross-sectional view illustrating an intermediate processing step in the manufacture of the ferroelectric capacitor in the fourth embodiment of this invention.

In the embodiments, the second ferroelectric film, either of amorphous or crystal form, increases the overall thickness of the film. Consequently, while the yield can be improved, a decrease in the electrostatic capacitance becomes inevitable. In another embodiment designed to solve this problem, the second ferroelectric film was removed by means of the dry etching method, leaving the second ferroelectric film on the cavity portions of the substrate alone. This embodiment can be explained with reference to FIGS. 7–9. In this embodiment, first of all, on oxidized silicon substrate 1, a TiN film 2 with a thickness of about 50 nm was formed as an adhesive layer using the sputtering method. Then, a Pt film 3 with a thickness of 200 nm was formed by sputtering. Then, a crystallized PZT film 6 was formed using the sol-gel method. In this processing step, a solution prepared by dissolving organic compounds of metals of Pb, Zr, Ti, etc., in an organic solvent was coated by the spin coating method to form a layer with a thickness of about 200 nm on Pt film 3. Then, [the substrates] were baked at about 150° C. to remove the organic solvent and moisture. Then, in order to crystallize the amorphous film, heat treatment was carried out in an oxygen atmosphere at 650° C. However, when PZT film 6 was crystallized, contraction took place, forming cavities on the intergranular crystal boundaries as shown in FIG. 7. Then, as shown in FIG. 8, at a substrate temperature of about 500° C., an amorphous STO film 7 with a thickness of about 10 nm or less was formed on PZT film 6. Then, as shown in FIG. 9, etch-back was performed in Ar plasma for an amount corresponding to 10 nm [of thickness], leaving amorphous STO film 7 selectively on the cavity portions of the intergranular crystal boundary of PZT film 6 alone. In this case, due to the etch-back operation in Ar plasma, oxygen hole defects, etc. are formed in the PZT film of the substrate. Consequently, the leakage current rises significantly. This would be a disadvantage. According to this embodiment, however, after etching back the STO film, heat treatment was carried out at a temperature appropriate for repairing the defects. In this way, it is possible to prevent a rise in the leakage current. By using this method, the initial insulation breakdown rate due to cavities in PZT film 6 can be reduced, and the yield of the capacitors formed can be increased.

In this embodiment, there is no decrease in the electrostatic capacitance of the capacitor. In particular, the size of the cavities on the intergranular crystal boundary of the PZT film is usually a few nm. Consequently, even when the insulating film with a low specific dielectric constant is filled into these cavities, the change in the electrostatic capacitance of the capacitor is still negligible.

In the embodiments, amorphous BST films were formed on PZT films. However, the same effect can also be realized when amorphous PZT film is formed on a BST film.

Figure 10:
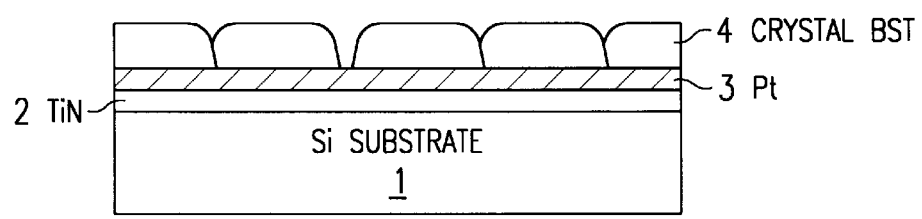
FIG. 10 is a cross-sectional view of the main portion illustrating the manufacture of the ferroelectric capacitor in a fifth embodiment of this invention.
Figure 11:
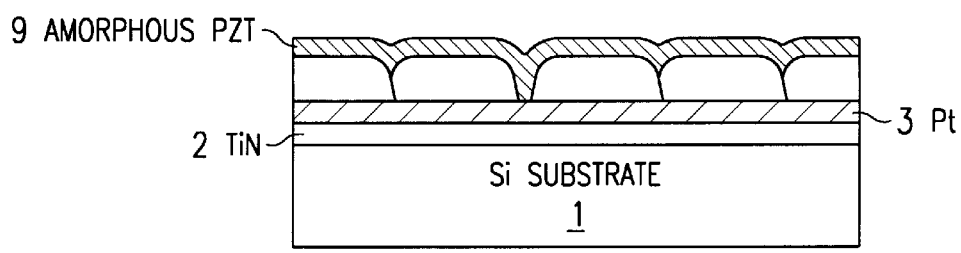
FIG. 11 is a cross-sectional view illustrating an intermediate processing step in the manufacture of the ferroelectric capacitor in the fifth embodiment of this invention.
Figure 12:
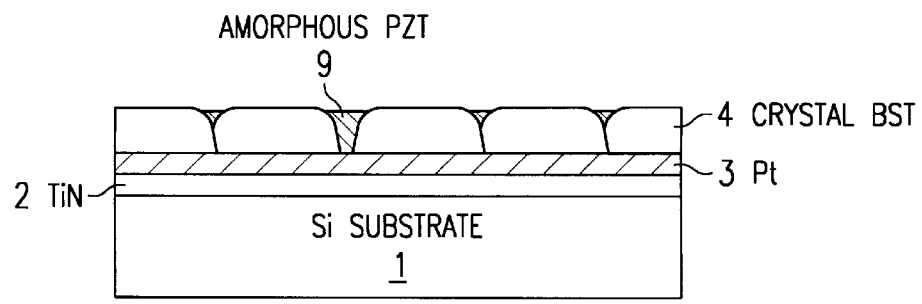
FIG. 12 is a cross-sectional view of the main portion illustrating the manufacture of the ferroelectric capacitor in the fifth embodiment of this invention.

In yet another embodiment of this invention, the PZT film as the second ferroelectric film is removed by dry etching, leaving only the second ferroelectric material on the cavity portions of the ferroelectric material of the substrate. This embodiment can be explained with reference to FIGS. 10–12. In this embodiment, first of all, on oxidized silicon substrate 1, a TiN film 2 with a thickness of about 50 nm was formed as an adhesive layer using the sputtering method. Then, a Pt film 3 with a thickness of 200 nm was formed by sputtering. Then, a crystallized BST film 4 was formed using the sol-gel method. In this processing step, a solution prepared by dissolving organic compounds of metals of Ba, Sr, Ti, etc., in an organic solvent was coated by the spin coating method to form a layer with a thickness of about 200 nm on Pt film 3. Then, [the substrates] were baked at about 150° C. to remove the organic solvent and moisture. Then, in order to crystallize the amorphous film, heat treatment was carried out in an oxygen atmosphere at 650° C. However, when BST film 4 was crystallized, contraction took place, forming cavities on the intergranular crystal boundaries as shown in FIG. 10. Then, as shown in FIG. 11, at a substrate temperature of about 500° C., an amorphous PZT film 9 with a thickness of about 10 nm or less was formed on BST film 4. Then, as shown in FIG. 12, etch-back was performed in Ar plasma for an amount corresponding to 10 nm [of thickness], leaving amorphous PZT film 9 selectively on the cavity portions of the intergranular crystal boundary of BST film 4 alone. In this case, due to the etch-back operation in Ar plasma, defects of oxygen holes, etc., are formed in the BST film of the substrate. Consequently, the leakage current rises significantly. This would be a disadvantage. According to this embodiment, however, after etching back the PZT film, heat treatment was carried out at a temperature appropriate for repairing the defects. In this way, it is possible to prevent a rise in the leakage current. By using this method, the initial insulation breakdown rate due to cavities in BST film 4 can be reduced, and the yield of the capacitors formed can be increased.

In this embodiment, there is no decrease in the electrostatic capacitance of the capacitor.

This invention may also be applied to ferroelectric materials other than BST. That is, the substantial effects can also be displayed when the ferroelectric films in the embodiments contain the following structural elements: $SrTiO_3$, $BaTiO_3$, $(Pb,La)(Zr,Ti)O_3$, $Pb(Zr,Ti)O_3$, $PbTiO_3$, etc.

In the above, explanation of this invention has been made with reference to the sputtering method and the sol-gel method. However, conventional methods, such as the CVD method, the MOD method, etc., may also be used as the growing method. In particular, when the sol-gel method is used to form the ferroelectric film, cavities are formed frequently on the intergranular crystal boundary during the crystallization operation, and the effect of this invention is particularly significant.

In the explanation, examples were presented with reference to the ferroelectric films for the DRAM capacitors, which form the background of this invention by the present inventors. However, this invention is not limited to this embodiment. For example, this invention may also be used for the capacitors of pseudo SRAM, the capacitors of condensers for boosting the word lines, and other types of [capacitors] used in semiconductor IC devices.

In the following, another embodiment of this invention will be explained with reference to FIGS. 13–29.

Figure 13:
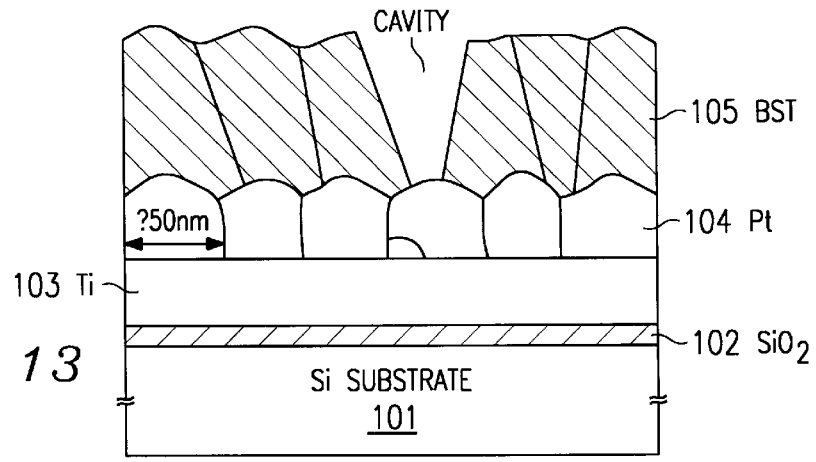
FIG. 13 is a cross-sectional view illustrating a ferroelectric (BST) capacitor film for explanation of the precondition of the invention.

In FIG. 13 which illustrates the precondition of this embodiment, a Ti film 103 with a thickness of about 50 nm is formed as an adhesive layer on oxidized silicon substrate 101 by means of the sputtering method, and a 200 nm thick Pt film 104 is formed by means of the sputtering method. Then, a BST film 105 with a thickness of about 200 nm is deposited by using BST ceramic target material in an $O_2/Ar$ mixture gas. In this case, the film is formed with the substrate temperature at about 650° C., and crystallized BST film 105 is formed. This is because if the temperature is lower than 500° C., the dielectric constant of the amorphous BST formed is about 18, much smaller than the specific dielectric constant of about 300 for the crystallized BST. Finally, a Pt upper electrode is formed. In this way, a capacitor is formed. Evaluation of the electrical characteristics of this capacitor indicates that the chance of the problems caused by initial insulation breakdown of the BST film is high, and it is impossible to guarantee an yield high enough for capacitors of ULSI. Results of analysis of the BST film on a transmission electron microscope and detailed analysis of the electrical characteristics indicate that as shown in FIG. 13, it is quite possible that the initial insulation breakdown of the BST film is due to the cavities generated on the intergranular crystal boundaries of BST film 105. It is estimated that this cavity portion leads to short circuit between the upper electrode and the lower electrode as Pt invades when the upper electrode Pt film is formed on the cavity portions. Consequently, in an embodiment of this invention, the cavities in the capacitor portion of the semiconductor device are filled up by an insulating film so as to increase the yield of the BST film.

Figure 14:
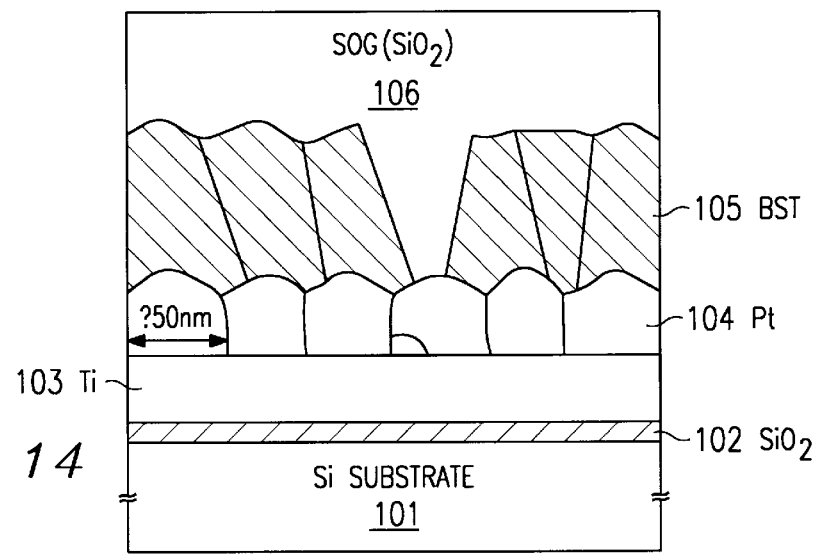
FIG. 14 is a cross-sectional view illustrating an intermediate processing step of the ferroelectric (BST) capacitor film in a sixth embodiment of this invention.
Figure 15:
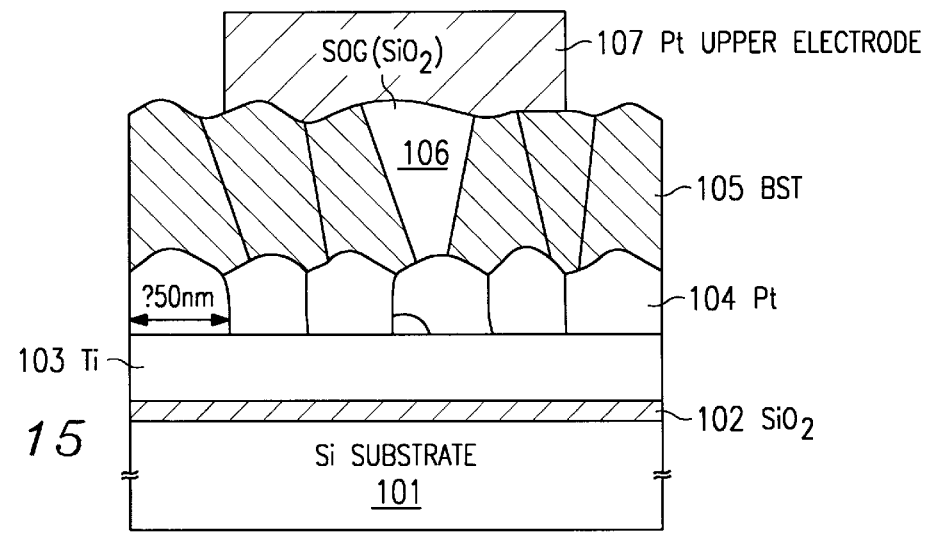
FIG. 15 is a cross-section illustrating the manufacture of the ferroelectric (BST) capacitor in the sixth embodiment of this invention.

In the following, another embodiment of this invention (Embodiment 6) will be explained with reference to FIGS. 14 and 15. FIG. 14 shows the structure of a TiN film 103 with a thickness of about 50 nm formed on oxidized silicon substrate 101 as an adhesive layer using the sputtering method, and a Pt film 104 with a 200 nm thickness formed by the spattering method. Then, a BST film 105 with a thickness of about 200 nm was deposited by using a BST ceramic target in an $O_2/Ar$ gas mixture. In this case, the substrate temperature was maintained at about 650° C. to crystallize BST film 105. In this embodiment, the cavities of BST film 105 are filled up by spin-on glass (SOG), an oxide of silicon. A precursor of SOG in liquid form was coated on the entire surface of the wafer by using a spinner (rotating coater) at a rotating speed in the range of 1000–5000 rpm. Then, [the substrates] were baked at a temperature in the range of 100–200° C. (depending on the boiling point of the solvent), followed by final curing at a temperature in the range of 350–450° C. FIG. 14 is a diagram illustrating the configuration in which the cavities of BST film 105 are filled up by SOG film 106 having a composition similar to $SiO_2$. FIG. 15 is a diagram illustrating the configuration in which the cavities are filled up by SOG film 106 after etching by hydrofluoric acid (HF) diluted to about 1% to remove an amount corresponding to the thickness of SOG film 106. In FIG. 14, the cavities are shown enlarged. Actually, the size of the cavities is a few nm or smaller. Consequently, it is easy for SOG to remain in the cavities in the etching operation. After this configuration was formed, a Pt upper electrode 107 with a thickness of about 200 nm was formed by the sputtering method, followed by conventional lithography to form the desired capacitor. As the yield is very high for the capacitors formed in this case, the yield may be appropriate for use in forming the capacitors for DRAMs of the future. Also, the effective specific dielectric constant is as high as about 300.

In the embodiment, etching of the SOG was performed using the wet method. However, the same effect can be realized by adopting the dry etching method.

Figure 16:
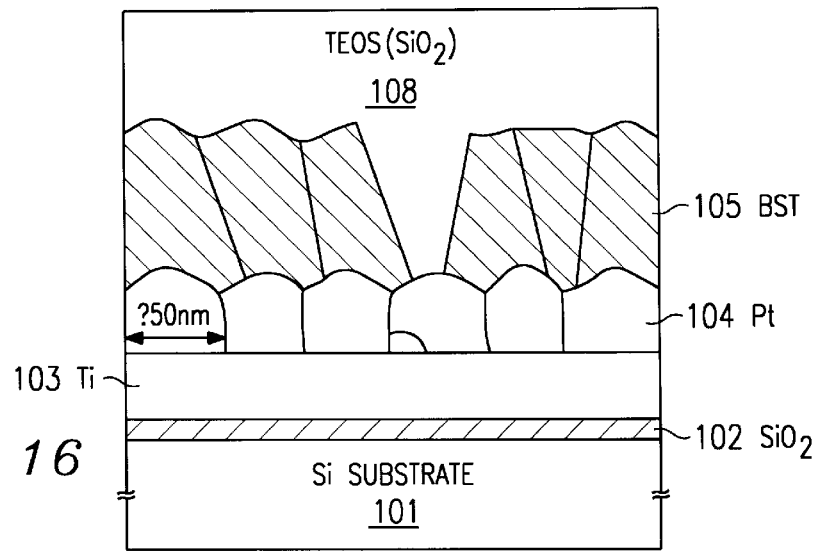
FIG. 16 is a cross-section illustrating an intermediate processing step of the ferroelectric (BST) capacitor film in a seventh embodiment of this invention.
Figure 17:
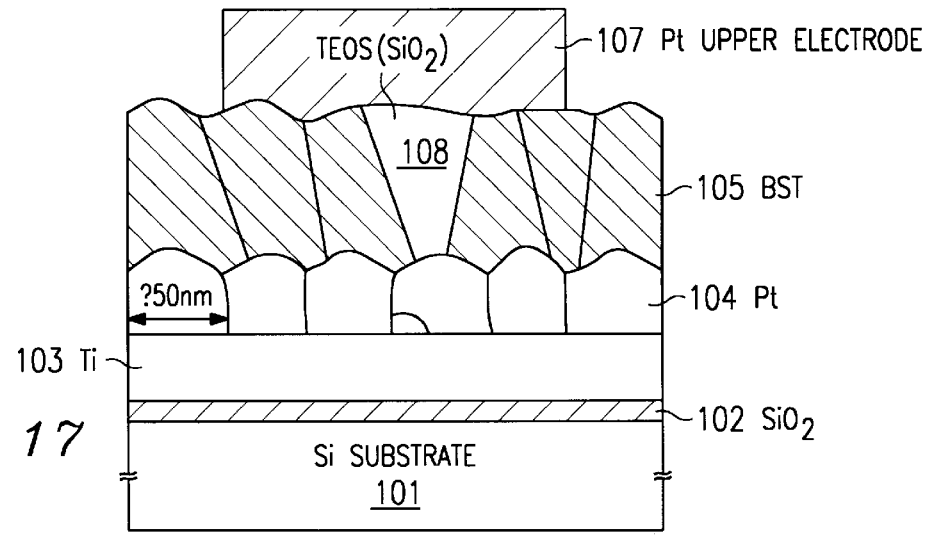
FIG. 17 is a cross-sectional view of the main portion illustrating the manufacture of the ferroelectric (BST) capacitor in the seventh embodiment of this invention.

In the following, yet another embodiment of this invention will be explained with reference to FIGS. 16 and 17. In this embodiment, a BST film 105 was formed by using the same method as in said Embodiment 6. Then, an oxide film 108 was formed by means of plasma CVD in $Ar/O_2$ atmosphere by using an organic oxysilane, such as Si(OC$_2$H$_5$)$_4$, at about 450° C. Usually, this oxide film is called TEOS film. FIG. 16 is a cross-sectional view illustrating the configuration in which the cavities of BST film 105 are filled by TEOS film 108 with a composition similar to SiO$_2$. Then, as shown in FIG. 17, etching was performed by hydrofluoric acid (HF) diluted to about 1% to remove an amount corresponding to the thickness of TEOS film 108. The cavity is filled with TEOS film 108 to form the structural element. In this case, since most of the BST film as the ferroelectric film is not etched off by HF, the BST film was not damaged in this treatment. After this configuration was formed, a Pt upper electrode 107 with a thickness of about 200 nm was formed by the sputtering method, followed by the conventional lithography to form the desired capacitor. As the yield is very high for the capacitors formed in this way, the yield may be appropriate for use in forming capacitors for DRAMs of the future. Also, it was found that the effective specific dielectric constant of the BST film is as high as about 300. In the embodiment, etching of the SOG [sic; TEOS] was performed using the wet method. However, the same effect can be realized by adopting the dry etching method.

Figure 18:
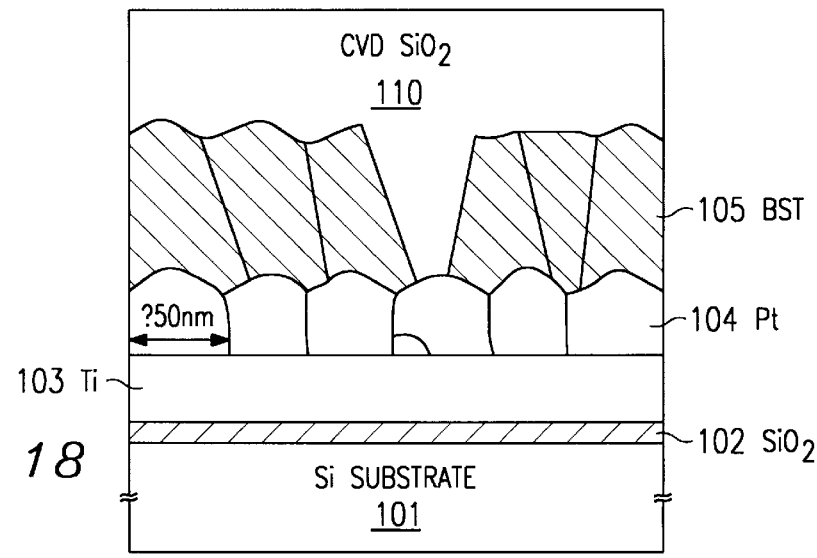
FIG. 18 is a cross-sectional view illustrating an intermediate processing step of the ferroelectric (BST) capacitor film in an eighth embodiment of this invention.
Figure 19:
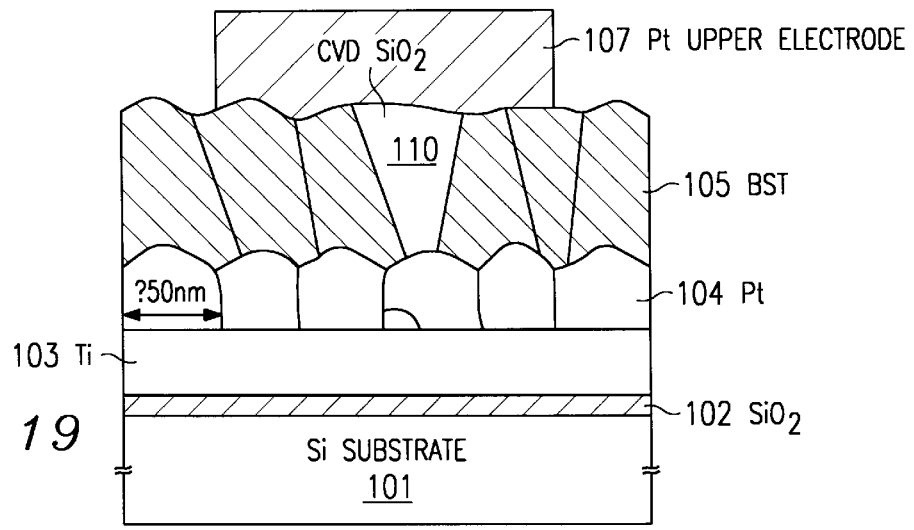
FIG. 19 is a cross-sectional view of the main portion of the ferroelectric (BST) capacitor in the eighth embodiment of this invention.

In the following, yet another embodiment of this invention will be explained with reference to FIGS. 18 and 19. In this embodiment, a BST film 105 was formed in the same way as in the above embodiment. Then, a CVD oxide film 110 was deposited on BST film 105 as shown in FIG. 18, by means of the ambient pressure CVD method, in which monosilane (SiH$_4$) was reacted in a temperature range from about 300° C. to 500° C. As a result, the cavities of BST film 105 are filled by CVD oxide film 110 with a composition similar to SiO$_2$. Then, dry etching was performed to remove an amount corresponding to the thickness of said CVD oxide film 110. In this case, the etching gases that can be used to etch CVD oxide film 110 may be the conventional etching gases for oxide film, such as CF$_4$/H$_2$ gas mixture, CHF$_3$, CHF$_3$/SF$_6$/He gas mixture, etc. When these etching gases are used, the selectivity of the etching rate of CVD oxide film 110 with respect to BST film 105 is very high. Consequently, as shown schematically in FIG. 19, it is possible to leave CVD oxide film 110 selectively in the cavity portions without damaging BST film 105. In this embodiment, etching of CVD oxide film 110 was performed using the dry etching method. However, it is also possible to adopt the wet method as adopted in the embodiments. Then, a Pt upper electrode 107 with a thickness of about 200 nm was formed by the sputtering method, followed by conventional lithography to form the desired capacitor. Since the yield is very high for capacitors formed in this way, the yield may be appropriate for use in forming capacitors for DRAMs of the future. Also, the effective specific dielectric constant is as high as about 300.

Figure 20:
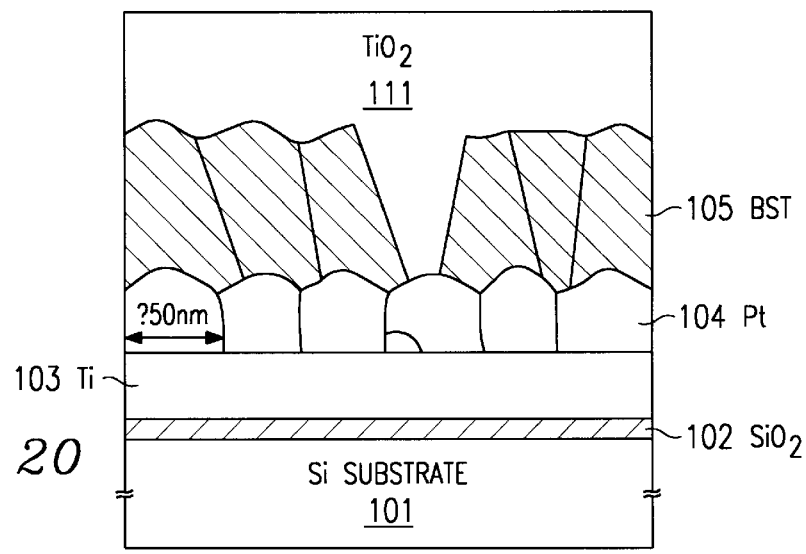
FIG. 20 is a cross-sectional view illustrating an intermediate processing step of the ferroelectric (BST) capacitor film in a ninth embodiment of this invention.
Figure 21:
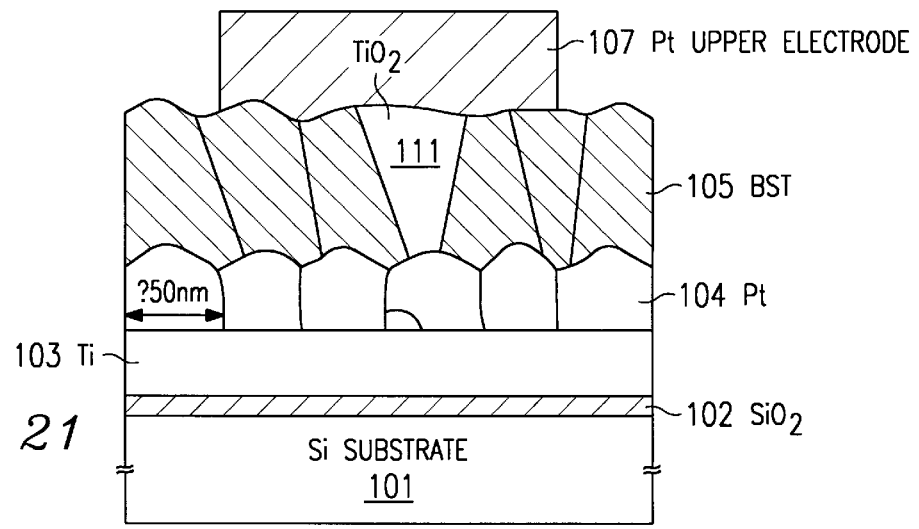
FIG. 21 is a cross-sectional view of the main portion of the ferroelectric (BST) capacitor in the ninth embodiment of this invention.

In the following, yet another embodiment of this invention will be explained with reference to FIGS. 20 and 21. In this embodiment, a BST film 105 was formed in the same way as in Embodiment 6. Then, a CVD-TiO$_2$ film 111 was deposited on BST film 105 as shown in FIG. 20, by means of the reduced-pressure CVD method, in which reaction was performed between tetraisopropoxytitanium Ti(i-OC$_3$H$_7$)$_4$ and oxygen in a temperature range from about 300° C. to 500° C. As a result, the cavities of BST film 105 are filled by TiO$_2$ film 111 with a composition similar to TiO$_2$ [sic]. Then, dry etching was performed to remove an amount corresponding to the thickness of said CVD TiO$_2$ film 111. In this case, the etching gases that can be used to etch CVD TiO$_2$ film 111 may be the conventional etching gases for oxide film, such as CF$_4$/H$_2$ gas mixture, CHF$_3$, CHF$_3$/SF$_6$/He gas mixture, etc. When these etching gases are used, the selectivity of the etching rate of CVD TiO$_2$ film 111 with respect to BST film 105 is very high. Consequently, as shown schematically in FIG. 21, it is possible to leave CVD TiO$_2$ film 111 selectively in the cavity portions. Then, a Pt upper electrode 107 with a thickness of about 200 nm was formed by the sputtering method, followed by conventional lithography to form the desired capacitor. Since the yield is very high for capacitors formed in this way, the yield may be appropriate for use in forming capacitors for DRAMs of the future. Also, the effective specific dielectric constant is as high as about 300.

In this embodiment, the CVD method was adopted for forming TiO$_2$ film 111. This, however, is merely for illustrating the concept of this embodiment. As a matter of fact, other methods, such as the sol-gel method, may also be used. In the sol-gel method, the TiO$_2$ film is formed as follows: a precursor is prepared by diluting tetraisopropoxytitanium Ti(i-OC$_3$H$_7$)$_4$ or other organic compound of metal by an organic solvent, such as methoxyethanol (CH$_3$OCH$_2$CH$_2$OH), acetic acid (CH$_3$COOH), or butanol (C$_4$H$_8$OH); then, the precursor is coated by means of the spin coating method, etc., on the BST film. The same effects as described above can be realized for the film formed using this method. In the embodiment, a TiO$_2$ film is used to fill the cavities of the BST film. However, it is also possible to use other materials, such as ZrO$_2$, HfO, ScO, Y$_2$O$_3$, V$_2$O$_5$, Nb$_2$O$_5$, etc. For example, to form a ZrO$_2$ film, the ZrO$_2$ film may be formed from Zr(OCH$_3$H$_7$)$_4$ or Zr(OCH$_4$H$_8$)$_4$ using the CVD method or the sol-gel method to fill the cavities of the BST film.

Figure 22:
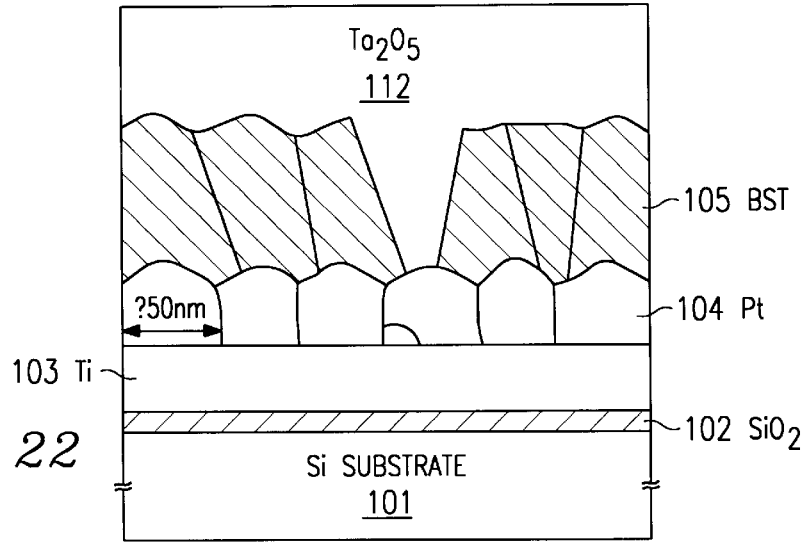
FIG. 22 is a cross-sectional view illustrating an intermediate processing step of the ferroelectric (BST) capacitor film in a tenth embodiment of this invention.
Figure 23:
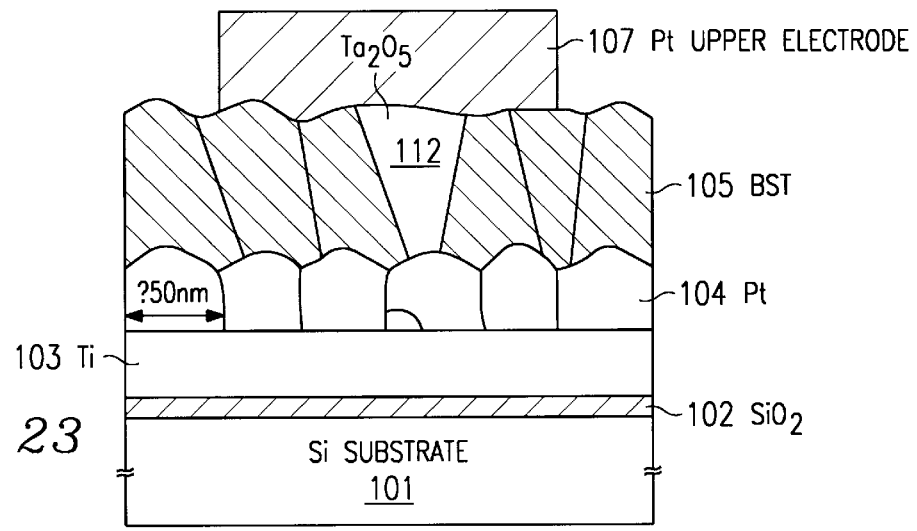
FIG. 23 is a cross-sectional view of the main portion of the ferroelectric (BST) capacitor in the tenth embodiment of this invention.

In the following, yet another embodiment of this invention will be explained with reference to FIGS. 22 and 23. In this embodiment, a BST film 105 was formed in the same way as in Embodiment 6. Then, a CVD Ta$_2$O$_5$ film 112 was deposited on BST film 105, by means of the reduced-pressure CVD method, in which a reaction was carried out between tantalum pentoethoxy Ta$_2$(i-OC$_3$H$_7$)$_5$ and oxygen in a temperature range from about 400° C. to 500° C. As a result, the cavities of BST film 105 were filled by Ti$_2$O$_5$ film 112 with a composition similar to Ta$_2$O$_5$ as shown in FIG. 22. Then, dry etching was performed to remove the thick portion of Ta$_2$O$_5$ film 112. In this case, the etching gases that can be used to etch Ti$_2$O$_5$ film 112 may be the conventional etching gases for oxide film, such as CF$_4$/H$_2$ gas mixture, CHF$_3$, CHF$_3$/SF$_6$/He gas mixture, etc. When these etching gases are used, the selectivity of the etching rate of Ta$_2$O$_5$ film 112 with respect to BST film 105 is very high. Consequently, as shown schematically in FIG. 23, it is possible to leave Ta$_2$O$_5$ film 112 selectively in the cavity portions. Then, a Pt upper electrode 107 with a thickness of about 200 nm was formed by the sputtering method, followed by conventional lithography to form the desired capacitor. Since the yield is very high for the capacitors formed in this way, the yield may be appropriate for use in forming capacitors for DRAMs of the future. Also, the effective specific dielectric constant is as high as about 300.

In this embodiment, the CVD method was adopted for forming Ta$_2$O$_5$ film 112. This, however, is merely for illustrating the concept of this embodiment. As a matter of fact, it is also possible to adopt the sputtering method. Usually, when the Ta$_2$O$_5$ film is to be formed by means of the sputtering method, the operation can be carried out easily in Ar containing about 10% oxygen.

Figure 24:
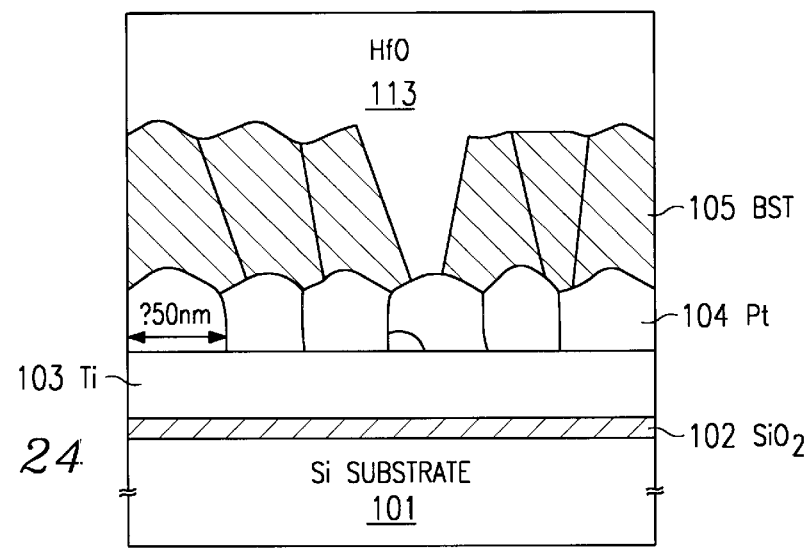
FIG. 24 is a cross-sectional view illustrating an intermediate processing step of the ferroelectric (BST) capacitor film in Embodiment 11 of this invention.
Figure 25:
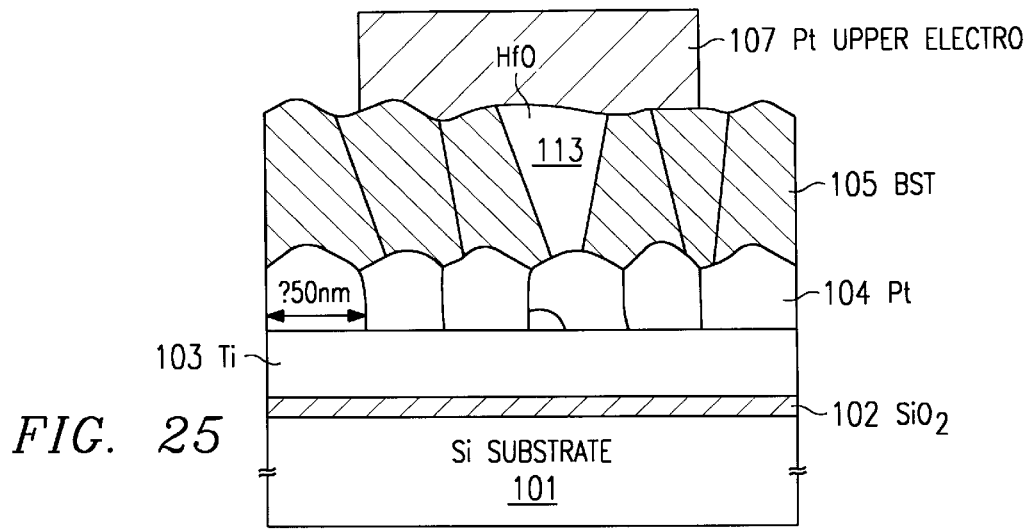
FIG. 25 is a cross-sectional view of the main portion of the ferroelectric (BST) capacitor in Embodiment 11 of this invention.

In the following, yet another embodiment of this invention will be explained with reference to FIGS. 24 and 25. As shown in FIG. 24, a BST film 105 was formed in the same way as in Embodiment 6. Then, a hafnium oxide HfO film 113 was formed by means of the sputtering method in a temperature range from about 400° C. to 500° C. in an argon gas containing about 10% oxygen. As a result, the cavities of BST film 105 are filled by hafnium [oxide] film HfO 113 as shown in FIG. 24. Then, dry etching was performed to remove an amount corresponding to the thickness of said hafnium oxide HfO film 113. In this case, the etching gases that can be used to etch hafnium oxide film 113 may be the conventional etching gases for oxide film, such as $CF_4/H_2$ gas mixture, $CHF_3$, $CHF_3/SF_6/He$ gas mixture, etc. When these etching gases are used, the selectivity of the etching rate of hafnium oxide film 113 with respect to BST film 105 is very high. Consequently, as shown schematically in FIG. 25, it is possible to leave hafnium oxide film 113 selectively in the cavity portions. Then, a Pt upper electrode 107 with a thickness of about 200 nm was formed by sputtering method, followed by conventional lithography to form the desired capacitor. Since the yield is very high for the capacitors formed in this way, the yield may be appropriate for use in forming capacitors for DRAMs of the future. Also, the effective specific dielectric constant is as high as about 300.

In this embodiment, the sputtering method was adopted for forming hafnium oxide film HfO 113. This, however, is merely for illustrating the concept of this embodiment. As a matter of fact, other methods, such as the CVD method, sol-gel method, etc., may also be used.

Figure 26:
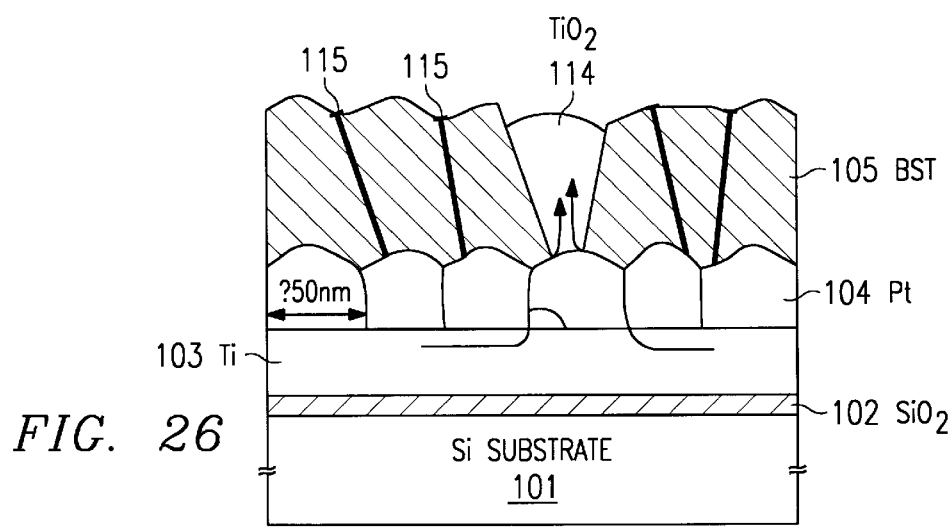
FIG. 26 is a cross-sectional view illustrating an intermediate processing step of the ferroelectric (BST) capacitor film in Embodiment 12 of this invention.
Figure 27:
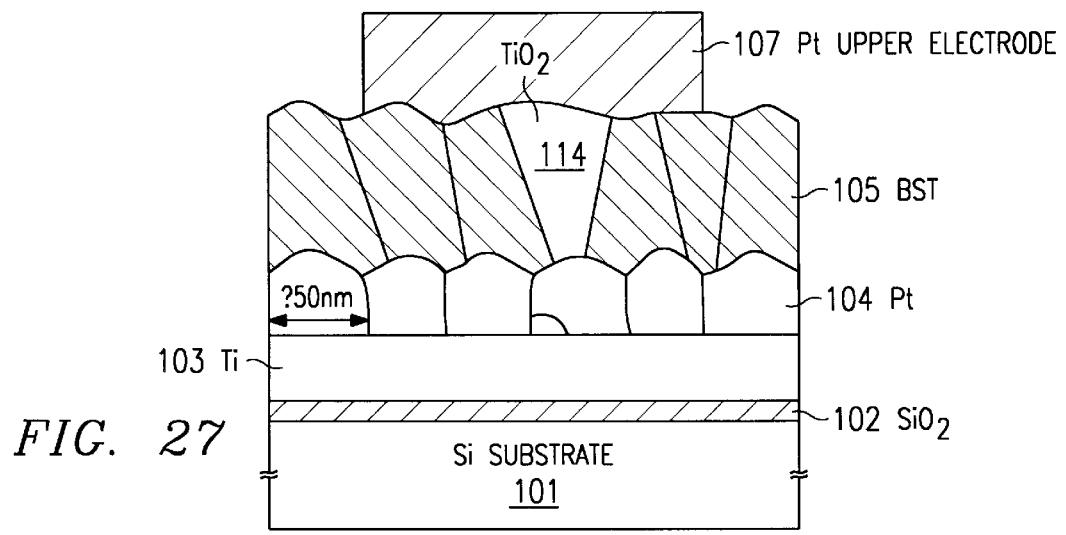
FIG. 27 is a cross-sectional view of the main portion of the ferroelectric (BST) capacitor in Embodiment 12 of this invention.

In the following, yet another embodiment of this invention will be explained with reference to FIGS. 26–27. In this case, heat treatment was performed at about 650° C. in an oxygen atmosphere for about 30 min. Consequently, Ti was diffused from Ti film 103 (or TiN) acting as an adhesive layer below Pt film 104 through the Pt film's intergranular crystal boundaries and was deposited to cover the cavities; it was oxidized in oxygen to form a $TiO_2$ film 114. This phenomenon has been confirmed by analysis on a transmission electron microscope. Also, the configuration displayed in this case has the intergranular crystal boundaries of BST film 105 free of cavities also covered. After Pt upper electrode 107 was formed, the electrical characteristics were evaluated. It was found that not only were the initial insulation problems of the capacitor solved, but also the leakage current flowing through the intergranular crystal boundaries—a disadvantage of the conventional method—was reduced. In this case, the specific dielectric constant of BST film 105 is about 300, and there is no decrease in the specific dielectric constant due to implementation of this embodiment.

Figure 28:
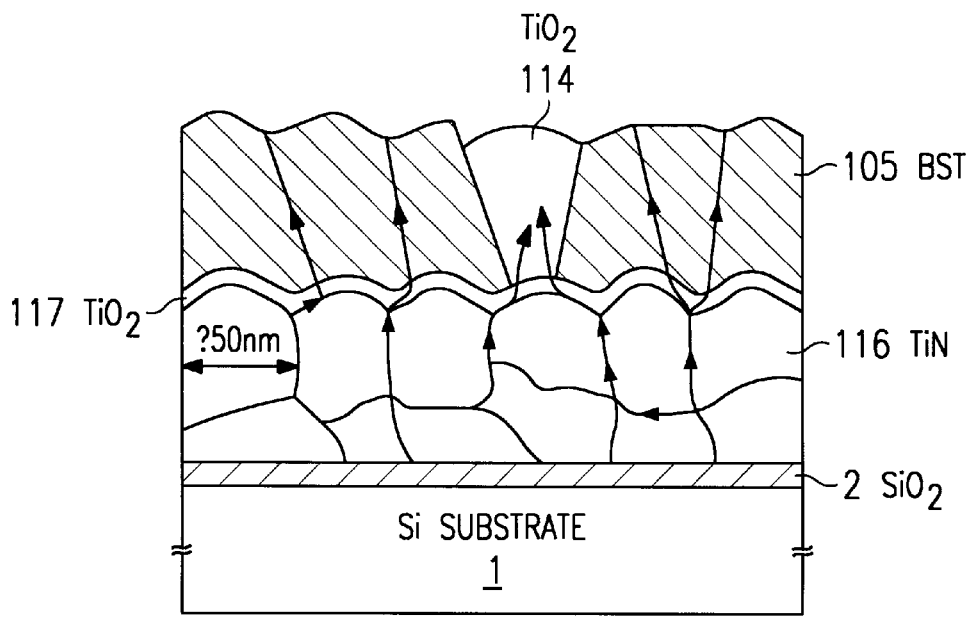
FIG. 28 is a cross-sectional view illustrating an intermediate processing step of the ferroelectric (BST) capacitor film in Embodiment 13 of this invention.
Figure 29:
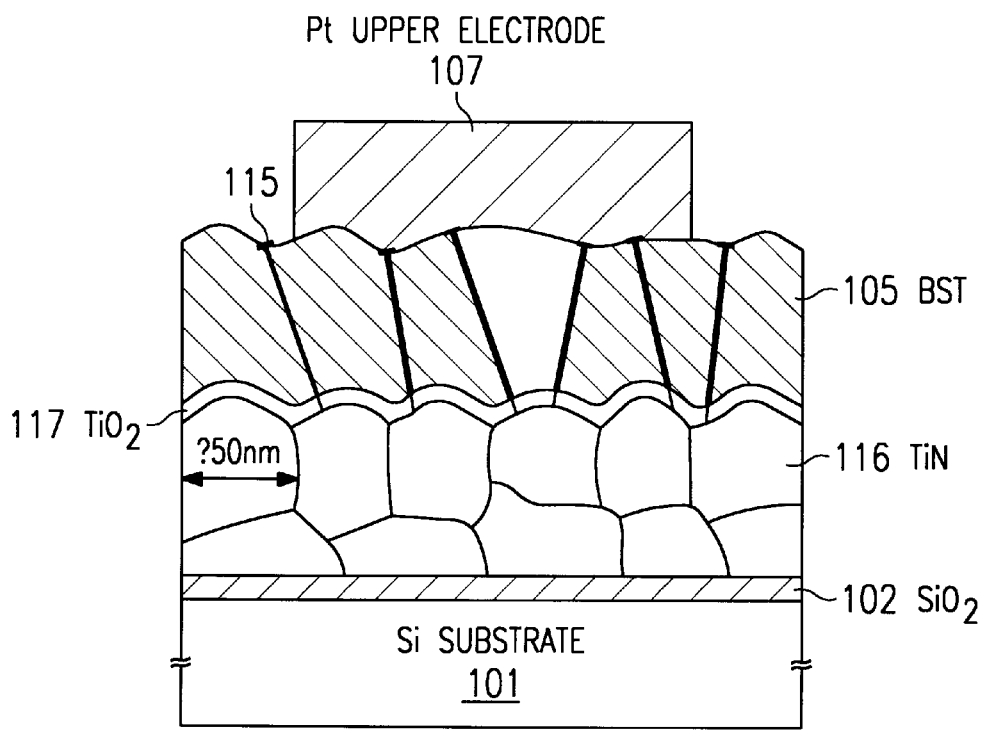
FIG. 29 is a cross-sectional view of the main portion of the ferroelectric (BST) capacitor in Embodiment 13 of this invention.

In the following, yet another embodiment of this invention will be explained with reference to FIGS. 28–29. In the embodiments, the capacitors were manufactured by using Pt film 104 as the electrode below ferroelectric BST film 105. However, the Pt film has some disadvantages. For example, it is very difficult to perform dry etching, and it may contain radioactive impurities that may cause errors in the software. Consequently, it becomes a problem for the introduction of the ferroelectric films into the manufacturing process of ULSI. In this embodiment, a capacitor manufacturing method without using Pt film 104 was adopted. As shown in FIG. 28, in the same way as in Embodiment 6, BST film 105 was formed directly on TiN film 116 as an adhesive layer, followed by heat treatment at about 650° C. for about 30 min in an oxygen atmosphere, so that the Ti diffused from TiN film 116 acting as the adhesive layer through the intergranular crystal boundaries of the BST film, and was oxidized and deposited to form $TiO_2$ films 114 and 115 that cover the cavities and intergranular crystal boundaries. FIG. 29 is a diagram illustrating the configuration in which electrodes were formed on the ferroelectric film. The phenomenon of deposition on the ferroelectric film has been confirmed by the analysis on a transmission electron microscope. After Pt upper electrode 107 was formed, the electrical characteristics were evaluated. It was found that not only were the initial insulation problems of the capacitor solved, but also the leakage current flowing through the intergranular crystal boundaries—a disadvantage in the conventional method—was reduced. In this case, the specific dielectric constant of BST film 105 is about 100, which is about ⅓ the specific dielectric constant of 300 of the BST films in Embodiments 6–12. This is believed to be related to the fact that a very thin $TiO_2$ film 117 was formed on the surface of TiN film 116 by the oxygen plasma as the BST film was formed. However, the insulation breakdown voltage of this BST film 105 is increased nearly three times. As the specific dielectric constants of the oxide film/nitride films used for the conventional DRAM capacitors are in the range of 4–7, the specific dielectric constant of 100 in this embodiment is within the effective range.

The embodiments do not imply that ferroelectric materials other than BST cannot be used. That is, the ferroelectric films of this invention may also contain $SrTiO_3$, $BaTiO_3$, $(Pb,La)(Zr,Ti)O_3$, $Pb(Zr,Ti)O_3$, $PbTiO_3$, etc., as the structural elements. Also, for the inserted films for suppressing growth of the cylindrical crystal in the films, the elements that form ferroelectric films and their oxides may also be contained. In the explanation of the growth method of the ferroelectric film in this invention, the sputtering method has been used as an example. However, other methods may also be adopted as the growth method, such as the CVD method, the sol-gel method using spin coating, etc. In particular, when the ferroelectric film is formed using the sol-gel method, the amorphous ferroelectric material is usually crystallized due to heat treatment. The effects of this invention are significant.

The above explanation pertains to the application of ferroelectric films in DRAM capacitors, which is the background of this invention. However, this invention is not limited to this application. For example, this invention may also be used for the pseudo-SRAM capacitors, capacitors for boosting word lines, and other types of [capacitors] used in semiconductor IC devices.

The following is a brief description of the typical effect of the invention disclosed in this patent application.

That is, according to this invention, by laminating ferroelectric films or by filling the cavity portions generated between the crystal grains after formation of the ferroelectric film with an insulating layer, it is possible to form ferroelectric films with small leakage current and high yield.

I claim:

1. A method for manufacturing a semiconductor device including a ferroelectric film capacitor having a laminated configuration, the method comprising:

forming a substrate;

forming a lower electrode over a portion the substrate;

forming a first ferroelectric film over the lower electrode, the first ferroelectric film being crystallized and having intergranular cavities substantially passed through to the surface of the lower electrode;

forming a second ferroelectric film over the first ferroelectric film, materials of the second ferroelectric film being filled in the intergranular cavities of the first ferroelectric film; and forming an upper electrode over the second ferroelectric film.

2. The method of claim 1 further comprising forming an insulative layer over a portion of the substrate before the step of forming a lower electrode so that the insulative layer is disposed between the lower electrode and the substrate.

3. The method of claim 1 further comprising forming an adhesive layer over a portion of the substrate before the step of forming a lower electrode so that the adhesive layer is disposed between the lower electrode and the substrate.

4. The method of claim 1 further comprising removing a portion of the second ferroelectric film by etching so that the step of forming the upper electrode forms the upper electrode such that the upper electrode is in direct contact with the first ferroelectric film.

5. The method of claim 1, wherein the step of forming a second ferroelectric film uses a different ferroelectric material than the step of forming a first ferroelectric film.

6. The method of claim 1 wherein the second ferroelectric film is amorphous.

7. The method of claim 1 wherein the second ferroelectric film is formed by crystallization from an amorphous material.

8. The method of claim 1 wherein the first and second ferroelectric films contain one or more of the following materials: $(Ba,Sr)TiO_3$, $SrTiO_3$, $BaTiO_3$, $(Pb,La)(Zr,Ti)O_3$, $Pb(Zr,Ti)O_3$, and $PbTiO_3$.

9. A method for manufacturing a semiconductor device including a ferroelectric film capacitor having a laminated configuration, the method comprising:

forming a substrate;

forming a lower electrode over a portion the substrate;

forming a ferroelectric film over the lower electrode, the ferroelectric film being crystallized and having intergranular cavities substantially passed through to the surface of the lower electrode;

forming an insulating oxide film, of a material different from the ferroelectric film, over the ferroelectric film, materials of the insulating oxide film being filled in the intergranular cavities of the ferroelectric film; and forming an upper electrode over the insulating oxide film.

10. The method of claim 9 further comprising forming an insulative layer over a portion of the substrate before the step of forming a lower electrode so that the insulative layer is disposed between the lower electrode and the substrate.

11. The method of claim 9 further comprising forming an adhesive layer over a portion of the substrate before the step of forming a lower electrode so that the adhesive layer is disposed between the lower electrode and the substrate.

12. The method of claim 9 further comprising removing a portion of the insulating oxide film by etching so that the step of forming the upper electrode forms the upper electrode such that the upper electrode is in direct contact with the ferroelectric film.

13. The method of claim 9 wherein the step of forming an insulating oxide film further comprises:

diffusing an element of the insulating oxide film through the lower electrode from a layer under the lower electrode; and oxidizing the element to form the insulating oxide film.

14. The method of claim 9 wherein the ferroelectric film contains one or more of the following materials: $(Ba,Sr)TiO_3$, $SrTiO_3$, $BaTiO_3$, $(Pb,La)(Zr,Ti)O_3$, $Pb(Zr,Ti)O_3$, and $PbTiO_3$.

15. The method of claim 9 wherein the insulating oxide layer comprises one or more oxides of elements selected from among: Si, Ta, Ti, Zr, Hf, Sc, Y, V, and Nb.

* * * * *